United States Patent [19]
Martens

[11] 3,902,975
[45] Sept. 2, 1975

[54] METHOD FOR TREATING NIOBIUM SURFACES USED IN AC CIRCUIT APPLICATIONS

[75] Inventor: Hans Martens, Erlangen, Germany
[73] Assignee: Siemens Aktiengesellschaft, Munich, Germany

[22] Filed: Aug. 7, 1973
[21] Appl. No.: 386,423

[30] Foreign Application Priority Data
Aug. 10, 1972 Germany ........................... 2239425

[52] U.S. Cl. ............... 204/35 N; 204/56 R; 204/140
[51] Int. Cl. ........................... C23b 5/50; C23b 9/00
[58] Field of Search .......... 204/26, 56 R, 32 R, 140, 204/35 N; 330/45, 56; 156/2, 3, 18, 20

[56] References Cited
UNITED STATES PATENTS
2,744,860 5/1956 Rines ................................. 204/222
3,784,452 1/1974 Martens ........................... 204/56 R

*Primary Examiner*—T. M. Tufariello
*Attorney, Agent, or Firm*—Kenyon & Kenyon Reilly Carr & Chapin

[57] ABSTRACT

An improved method of treating niobium surfaces which are used in AC circuit applications such as high frequency resonators in which a niobium pentoxide layer is first produced on the niobium surface using an electrolyte free of fluoric acid and which does not attack the niobium pentoxide, after which the layer is removed to result in a finished product which exhibits extremely good electrical properties particularly when used in superconductor AC applications.

14 Claims, No Drawings

METHOD FOR TREATING NIOBIUM SURFACES USED IN AC CIRCUIT APPLICATIONS

BACKGROUND OF THE INVENTION

This invention relates to the treatment of niobium surfaces which are used for AC circuit applications in general and more particularly to such a method which provides improved performance characteristics.

It has been well established that niobium is well suited as a superconductor for use in AC circuit applications. Hollow niobium bodies are used for example as superconducting high frequency resonators or separators for particle accelerators. Niobium is also well suited in tubular or wire form, as a superconductor for superconducting single or three-phase cables. In all applications of niobium as an AC superconductor the physical condition of the surface is of particular importance since fields of electromagnetic waves or AC currents penetrate only to a depth of about 300 – 400 A. into the superconductor. Thus a surface which is uneven or contains impurities can impair the properties of the superconductor leading to increased AC losses at the surface.

The superconductor properties of niobium surfaces which are used to carry AC current and in particular those of superconducting niobium cavitity resonators can be substantially improved by generating a niobium pentoxide layer on the niobium surface facing the resonator cavity and which carries the AC current. Such a layer may be generated in an electrolytic process using an electrolyte which is free of fluoric acid; in particular use of an ammonia solution. The advantage of such is disclosed in *Physics Letters*, 34*a*, 1971, pp. 439–430. With a niobium pentoxide layer of a thickness in order of 0.1 micrometer, a substantial increase in the quality factor and the critical magnetic field $H_c^{rf}$ measured in the presence of alternating fields has been obtained in such niobium cavity resonators. This has been accomplished without the need for the otherwise customary and very expensing degasing anneal of the resonator in an ultra high vacum at a temperature of about 2000°C. [for discussion of this annealing method see, for example, the *Journal of Applied Physics*, Vol. 39, 1968, pp. 4417–4427, *Applied Physics Letters*, Vol. 13, 1968, pp. 390–391 and *Applied Physics Letters*, Vol. 16, 1970, pp. 333–335].

Although this previously disclosed method of generating a niobium pentoxide layer on the niobium surface works quite well in most cases there are certain applications in which a niobium pentoxide layer is not desirable.

SUMMARY OF THE INVENTION

The present invention provides an improved method of treating niobium surfaces to obtain excellent electrical characteristics which avoids some of the problems associated with prior art methods. In simplified terms the method of the present invention comprises first generating a niobium pentoxide layer and then chemically removing that layer. It has been discovered that if a niobium surface is first provided with a niobium pentoxide layer which is generated by anodic oxidation in an electrolyte which is free of fluoric acid and which will not attack the niobium pentoxide, and the surface layer of niobium pentoxide is then removed, the niobium continues to exhibit excellent superconducting properties even after removal. Apparently, if the niobium pentoxide layer is generated, advantageous changes are produced in a surface layer of the niobium, the thickness of which corresponds approximately to the depth of pentration of an AC current, i.e., to about 300–400 A., and, when the niobium pentoxide layer is removed, the advantages previously obtained are still present. The exact reason for this phenomenon has not been completely verified. However, it is believed that the changes are based on the diffusion of small quantities of oxygen into a thin surface layer of the niobium which is situated underneath the niobium pentoxide layer.

It has been further discovered that after removing the niobium pentoxide layer, the niobium surface is much less sensitive to the effects of air, which are generally detrimental and degrade the surface properties, than a niobium surface which has not been so treated.

DETAILED DESCRIPTION OF THE PREFERRED EMBODIMENT

In carrying out the method of the present invention a niobium pentoxide layer is first generated on the niobium surface, which layer is of a continually increasing thickness with oxidation time, using an electrolyte which is free of fluoric acid. In the second step the niobium pentoxide layer is chemically removed. This differs basically from the electropolishing method described in *Physics Letters*, Vol. 37*a* [1971] pp. 139–140 and that described in *German Offenlegungsshrift* No. 2,027,156. In the methods described therein for electropolishing, the niobium part to be polished is placed as the anode in an electrolyte consisting of 86–93% by weight of $H_2SO_4$, 1.5 to 4% by weight of HF and 5.5–10% by weight of $H_2O$ at a temperature of between 15° and 50°C. Subsequently a constant electric voltage between 9 and 15 volts is applied between the annode and a cathode which is immersed in the electrolyte. The voltage is applied such that current oscillations superimposed on the electrolyte current occur. The current oscillations are caused by the build up and the immediately following partial decomposition of a niobium oxide layer. Over a period of several minutes, the mean thickness of the niobium oxide layer increases and leads to a decreasing and dying out of the current oscillations. At this point the voltage is switched off until the niobium oxide layer is dissolved in the fluoric acid which is found in the electrolyte. The constant voltage is again switched on and the cycle of states with the voltage connected and disconnected repeated several times. This method is well suited for the removal of niobium layers about 100 micrometers and more thick while at the same time producing a mirror smooth surface. However, this method alone does not lead to good superconductor properties such as those which can be obtained through the method according to the present invention. This is illustrated in particular by the fact that the superconductive properties of niobium surface which have been electropolished by the above describe method can be substantially improved by the method of the present invention.

The method of the present invention is particularly advantageous in applications where no niobium pentoxide layer is to be left on the niobium surface which is being treated. This may be a requirement, for example, where the niobium surface is to be used in a resonator of a particle accelerator where it will be subjected to large doses of ionizing radiation, e.g., electron radiation, which can cause damage to the niobium pentoxide layer, or if the dielectric losses in the niobium pentoxide layer, which are generally small, will have a detrimental effect in the particular applications where the superconductor is being used.

In performing the method of the present invention it has been found particularly advantageous to repeat several times the steps of annodic oxidation and chemical dissolution. This is the case since the niobium pentoxide layer generated by the first annodic oxidation will occasionally contain certain irregularities leading to a situation where the dissolution of the oxide layer will take more or less time at different points on the niobium surface. This can affect the properties of the niobium surface adversely. By repeating the steps several times, the oxide layers which are generated in the later steps are very uniform and the effects are thereby avoided.

To prevent the niobium surface from being etched and thereby being roughened, the niobium pentoxide layer is preferably dissolved using a liquid which reacts strongly with the niobium pentoxide but at most weakly with the niobium. In particular fluoric acid in concentrations of 20–50%, i.e., a solution of 20–50% by weight of HF and $H_2O$ may be used to obtain a fast, complete and uniform dissolution. As the concentration fo the flouric acid is lowered the reaction with the niobium pentoxide becomes weaker and at the same time the reaction with the niobium is increased as long as the concentration of fluoric acid is not below 10%. Typically with a 40–50% fluoric acid solution at a temperature of 22°C. a niobium pentoxide layer about 10–15 micrometers thick can be dissolved per hour. Such a concentration will only remove from a pure niobium surface a niobium layer of approximately $10^{-2}$ micrometers thick in the same time span.

A preferred electrolyte for generating a largely homogenous, uniformly growing niobium pentoxide layer in the annodic oxidation process in an aqueous ammonia solution preferably with 5–30% of ammonia by weight. Particularly advantageous is a solution which can contain about 25% by weight of ammonia. However, other ammonia concentrations may also be used where, for example, an increase in the electric conductivity of the electrolyte bath is desired. At concentrations of less than 25% by weight, the conductivity of the bath initially increases by the factor of 2–3 and then decreases again with further decreasing concentration.

In addition it is preferable during the step of dissolution of the niobium pentoxide layer to subject the bath to ultrasound. Especially, in the repeated generation and dissolution of relatively thick niobium pentoxide layers having a thickness of about 0.25 micrometers, surface disturbances can remain on the niobium which appear as grey or brown spots. However, by subjecting the dissolution bath to ultrasound, such disturbances can be reliably prevented. This treatment is particularly effective if after dissolving the niobium pentoxide layer in a fluoric acid bath which is subjected to ultrasound, the niobium surface is then rinsed in a bath of hydrogen peroxide also subjected to ultrasound. Such a bath of hydrogen peroxide should contain at least 2% by weight of hydrogen peroxide, and preferably between 5 and 30% by weight, with the balance being water.

Here additional advantages may be obtained if the anodic oxidation is also performed in an electrolytic bath which is subject to ultrasound, particularly if the niobium surface of the oxide is not chemically pure. In this case the ultrasonic vibrations have an oxidation promoting effect especially in the first oxidation, fulfilling on one hand, particularly in conjunction with an ammonia bath, a cleaning function, and on the other hand serving to remove a coating of gas bubbles of molecular oxygen which readily forms at a contaminated niobium surface and impedes the action on the niobium surface of the atomic oxygen which is formed during the oxidation.

It is also recommended that the entire surface of the niobium part which is to be treated be oxidized before hand. Differences in the attack of the dissolving liquid on oxidized and oxide free parts of the surface can thereby be avoided.

The invention will be further illustrated with the aid of the following examples:

EXAMPLE 1

A $TE_{011}$ field-type cavity resonator of circular cylindrical geometry designed for use at a frequency of 9.5GHz was constructed of two parts; a cup-shaped lower part with an inside diameter and an inside height of 41mm, and a disc shaped lid. For operation, the lower part and lid were sealed together in a vacuum tight manner by an annular idium seal. The indium seal was arranged in a slot in the end face, facing the lid, of the cup-shaped lower part. To couple microwave energy, two coupling holes each with a diameter of 1.5mm were provided in the lid. On the outside of the lid chimney extensions for use in coupling microwave energy were provided leading from the coupling hole. One of the coupling holes was also adapted to evacuate the interior of the resonator.

Both parts of the resonator were machined from solid, electron beam melted niobium material which had large crystal grains. After machining, the surface roughness was about 1 micrometer. The lower part and lid were then electropolished using the prior art method described above, during which polishing, a surface layer of about 150 micrometers was removed from the inside of both the resonator and lid. After rinsing with distilled water, the resonator was assembled in laboratory air, evacuated and cooled down. In order to avoid any dirt particles falling from the coupling holes into the interior of the resonator, the latter were arranged so that the coupling lines opened into the resonator cavity from below. After an evacuation period of about 15 hours using a molecular turbo pump, an unloaded $Q_0$ of about $2.8 \times 10^9$ was measured at a temperature of about 1.5 K and a critical magnetic field $H_c^{ac}$ about 46mT. For the purposes herein, the critical magnetic field is defined as that magnetic field at the resonator surface where $Q_0$ drops by several orders of magnitude within a few microseconds if the field is exceeded.

Through the use of anodic oxidation of the inside surface of the resonator cavity in a 25% ammonia solution to thereby form a niobium pentoxide layer, it was possible to increase the $Q_0$ to $2.7 \times 10^{10}$ and the critical magnetic field $H_c^{ac}$ to about 77mT. In the course of fruther investigation, during which the resonator was subjected to high stresses by warming it several times to room temperature and then cooling it to low temperatures, and in which it suffered surface contamination of a burned up dust particle and was then stored for several months in a poor vacuum, the $Q_0$ dropped to about 7

$\times 10^9$ and the critical magnetic field $H_c^{ac}$ to about 54 mT. After the measurements from which this data was obtained, the resonator was then brought up to room temperature and disassembled.

The niobium pentoxide layer previously formed was dissolved from the inside of the cup-shaped lower part using a 40% fluoric acid solution. A new niobium pentoxide layer was generated by anodic oxidation and again dissolved. The anodic oxidation and subsequent chemical dissolution were repeated two more times. Finally another anodic oxidation was performed so that in the final condition a niobium pentoxide layer remained on the inside of the cup-shaped lower part of the resonator. In performing the anodic oxidation, the lower cup-shaped part of the resonator was used as the vessel for the oxidation bath being filled to the brim with an aqueous ammonia solution having 25% by weight of ammonia. This allowed avoiding the deposit of an oxide layer on the end face of the lower part in which the slot for the indium seal is located and which if covered with such a layer would not be properly conductive. In addition, the slot was covered with a plastic ring clamped thereto. This ring, in addition to protecting the surface, avoided any spilling of the ammonium bath when it was placed in the lower part. The lower part was then connected to the positive terminal of a voltage source and a niobium tube of about 25 millimeters outside diameter connected to the negative terminal of the source and immersed about 30 millimeters into the bath coaxially with the cylindrical axis of the lower part of the resonator. The bath temperature was maintained at about 20°C. During the anodic oxidation the electric voltage between the anode and cathode was increased in steps of 10 volts to 100 volts. At the beginning of each step the anodic current density was about 3ma/cm$^2$. The switch to the next step was made when the current density had dropped to about 1.5 ma/cm$^2$. Total time of anodic oxidation was approximately 4 minutes resulting in a niobium pentoxide layer with a thickness of about 0.28 micrometers. Each of the subsequent steps of anodic oxidation were carried out in this manner.

To dissolve the niobium pentoxide layer, a 40% fluoric acid solution with a temperature of about 20°C was filled into the lower part of the resonator, after emptying out the ammonia, and left in place until the niobium pentoxide layer, which initally had a green color of the third order, was no longer optically visible. This dissolution took about three minutes. To assure complete dissolution, the fluoric acid was left in place for another 1.5 minutes. After each dissolution the part was rinsed with distilled water.

The resonator lid, which in this special case had also been subjected to a degassing anneal in a ultra-high vacuum at a temperature of about 2,000°C was treated in a similar manner. However, since it was not itself suited as a vessel for the bath, it was immersed in a vessel filled with the ammonia solution in such a manner that the inside surface of the lid was vertical during anodic oxidation. The contact surface for the indium ring seal was covered with a plastic ring. A niobium wire was used to connect to the positive terminal of the current source. A niobium disc cathode was placed in the bath on both sides of the resonator lid in order to insure oxidation of not only the inside of the lid but also the outside and the coupling holes. For dissolution of the niobium pentoxide layer the resonator lid was immersed for about 6 minutes in a vessel filled with 40% fluoric acid. Unlike the treatment of the lower part of the resonator, the lid was not oxidized in the final process step. After dissolution of the last oxide layer it was instead left without an oxide layer.

After completion of the above described treatments, both the lower part of the resonator and the lid were washed in distilled water and acetone, assembeled and, after installation in a cryostat, evacuated and cooled down. After evaluation for a period of about 15 hours, an unloaded $Q_0$ of about $2.4 \times 10^{10}$ and a critical magnetic field of $H_c^{ac}$ of about 120 mT were measured at a temperature of about 1.5 K. On the basis of the field distribution in the interior of the resonator it was concluded that the critical magnetic field on the inside of the resonator lid whose niobium pentoxide layer had been dissolved was at least 80mT.

Even after repeated heating of the resonator to room temperature and cooling to 1.5 K, and after storing for 8 days in open air these excellent values for $Q_0$ and $H_c^{ac}$ remained almost unchanged. Since the initially applied niobium pentoxide layer was dissolved from the inside of the resonator lid, this shows clearly that the niobium surfaces treated according to the present invention are essentially insensitive to air after the oxide layer is dissolved. After being stored in air for 8 days, the lower part of the resonator and the lid were anodically oxidized in the manner described above three and four times respectively. Each time the outside layer was dissolved chemically. In the concluding step a niobium pentoxide layer of about 0.28 micrometers was generated on the inside of the lower part of the resonator and the resonator lid. After some time, this oxide layer was dissolved with a 40% fluoric acid solution. The resonator parts were then allowed to stand in air for two hours prior to assembly. After assembly, the resonator which was now without any oxide layer, showed an unloaded $Q_0$ of about $2.7 \times 10^{10}$ and a critical magnetic field of about 100mT. This again illustrates that excellent surface properties can be obtained through the method of the present invention.

In further test, the inside of the resonator was again anodically oxidized repeatedly, with the layer always being dissolved aftewards. In carrying out the step of dissolving, a 50% fluoric acid solution was sometimes used. Through the use of this concentration the oxide layer of about 0.28 micrometers was dissolved in about on minute without any visible trace remaining. However, with the increasing number of anodic oxidations, disturbing brown and brown grey spots on the inside of the resonator were noted. This in turn led to a decrease of the critical magnetic field $H_c^{ac}$ to about 52mT. The condition for dissolving the oxide layers was therefore changed.

EXAMPLE 2

In order to prevent the borwn and or brown grey deposits, or to dissolve thin deposits already formed dissolution in the fluoric acid bath was carried out with ultrasound applied to the solution and with subsequent washing of the niobium surface in a hydrogen peroxide solution, also under the action of ultrasound. For the ultrasound treatment the lower part of the resonator filled with the fluoric acid solution and/or the vessel in which the lid was being treated filled with fluoric acid solution, was placed into a tray having ultrasonic oscillatiors attached to the bottom. The tray contained a liquid, for example, water, which transmits the ultrasound to the fluoric acid and the resonator parts. A commercially available ultrasonic bath tray with an ultrasonic frequency of 50HKz was used. The ultrasound power, as referenced to the entire volume of liquid of about 2 liters in the tray, was 100 watts. Of course, for processing larger niobium parts, more ultrasonic power is required. The particular ultrasound frequency is not of critical importance; commercial available ultrasonic bath tanks with an ultrasound frequency of 20KHz for example are also suitable.

After cleaning the inside surface of the resonator in the fluoric acid bath with ultrasound, it was possible, by anodically oxidizing two to four times, and subsequently dissolving the niobium pentoxide layer after each step of oxidation, and then with a final generation of a niobium pentoxide layer, to increase the field strength $H_c^{rf}$ of the resonator to 97mT. The unloaded $Q_0$ at this point was approximately $2.5 \times 10^{10}$. After one day the niobium pentoxide layer was dissolved using a fluoric acid bath in the presence of ultrasound. After dissolution of the oxide layer, the critical field strength $H_c^{rf}$ of the resonator remained about 95mT. and was thus almost unchanged.

For dissolving the oxide layer in the presence of ultrasound a 50% fluoric acid solution was used which dissolved the layer in a few minutes. Subsequent to the dissolution the resonator parts were filled [without intermediate washing in distilled water] with a 6.5% by weight aqueous hydrogen peroxide solution or immersed in this solution and allowed to remain in contact with this solution in the presence of ultrasound for approximately 3 seconds. The parts were then rinsed with water. The anodic oxidation again was performed with a 25% ammonia solution. In the oxidation process a constant current density of 3 ma/cm$^2$ was maintained and oxidizing continued until the electric voltage across the generated niobium pentoxide layer was about 100 volts and the layer thickness about 0.28 micrometers. During the first of the various successive oxidations steps the electrolytic bath was subjected to ultrasound in the manner described above in connection with fluoric acid bath. Each of the individual oxidations took approximately 4 minutes. After each oxidation the parts were washed with distilled water.

Further investigations have indicated that the oxidation times can be further reduced without any detrimental impact by increasing the anodic current density. For example the generation of a niobium pentoxide layer about 0.28 micrometers thick as described above will take only 10 seconds with an anodic current density of about 40 ma/cm$^2$. While the anodic current density can be increased even further without any undesirable effects, care must be taken that it does not drop below 1.5 ma/cm$^2$, since, below this current density, a fine, hard to remove deposit frequently forms on the niobium surface. To avoid any such problems it is preferable to work with an anodic current density of at least 3 ma/cm$^2$. When operating with a current density which is not constant, such as that process described above where the voltage was increased in steps, a value below 1.5 ma/cm$^2$ can be tolerated temporarily if the current density is then increased a corresponding amount during the remainder of the time.

The step of washing the niobium surface in the hydrogen peroxide solution should be at least of sufficient duration to remove the last traces of oxide from the surface but should also be short enough to prevent any etching effects of the residual diluted fluoric acid, which gets into the hydrogen peroxide solution, on the niobium surface. Depending on the concentration of the hydrogen peroxide solution, washing times in the range of 1 to 20 seconds may be used. With increasing hydrogen peroxide concentrations the washing times should be reduced.

Other solutions may also be used for dissolving the niobium pentoxide layer. For example a mixture of fluoric acid and sulfuric acid in particular 20% by volume of 50% fluoric acid and 80% by volume of 95–97% sulfuric acid may be used. However, slight deposits may occur on the niobium surface if such a mixture is used, even if ultrasound is applied during the dissolving steps. In addition, a potassium hydroxide solution may be used to dissolve the niobium pentoxide. However the danger exists that, in subsequent anodic oxidizing, undersirable disturbances in the form of deposits can occur. Therefore fluoric acid particularly with 40 to 50% by weight of HF and the balance water is preferable.

It is also possible to use other electrolytes for the anodic oxidation of the niobium. For example sulfuric acid may also be used.

As is illustrated from the above examples, the method according to the present invention is suited not only for the independent treatment and improvement of niobium surfaces, but also may be used for regenerating pretreated niobium surfaces such as those which already have been anodically oxidized. The method of the present invention allows simple restoration of originally present good surface properties by removing a contaminated surface layer without degrading the mechanical quality of even the smoothest surface. Since the niobium pentoxide layers generated by this method of the present invention, which are then subsequently chemically dissolved, are very thin, the dimensions of the treated niobium parts, which are often very important when used in devices such as cavity resonators, are not adversely effected.

Although disclosed in connection with treating the inside surfaces of a resonator cavity, the method of the present invention is also suitable for use in the treatment of the outer surface of resonant helixes and also for the surface treatment of niobium conductors for superconducting single and three phase cables, for example.

Thus an improved method of treating niobium surfaces has been described. Although specific embodiments have been discussed and described, it will be obvious to those skilled in the art that various modifications may be made without departing from the spirit of the invention which intended to be limited solely by the appended claims.

What is claimed is:

1. A method of treating a niobium surface which is to be used in an AC circuit application comprising carrying out, at least once, steps consisting of:

a. generating, by anodic oxidation in an electrolyte which is free of fluoric acid, a niobium pentoxide layer on the niobium surface; and b. chemically dissolving the generated niobium pentoxide layer, said dissolution always being the final step.

2. The method according to claim 1 wherein the steps of anodic oxidation and chemical dissolution are repeated several times always ending with a step of chemical dissolution to end up with a pure niobium surface.

3. The method according to claim 1 wherein the niobium pentoxide layer is dissolved by a liquid having properties causing it to strongly react with the niobium pentoxide and weakly react with the niobium.

4. The method according to claim 3 wherein the niobium pentoxide layer is dissolved using fluoric acid in a concentration in the range of 20 to 50%.

5. The method according to claim 4 wherein said concentration is 40–50%.

6. The invention according to claim 1 wherein the anodic oxidation is performed in an aqueous ammonia solution in the range of 5 to 30%.

7. The method according to claim 6 wherein the concentration of said ammonia solution is 25%.

8. The method according to claim 1 wherein during dissolution the dissolving liquid is subjected to ultrasound.

9. The method according to claim 8 and further including the step of washing the niobium surface in a bath of hydrogen peroxide solution, which is subjected to ultrasound, after the step of dissolving.

10. Invention according to claim 9, wherein said washing is performed in a bath having a concentration of hydrogen peroxide of at least 2%.

11. The invention according to claim 10, wherein said concentration is in the range of 5 to 30%.

12. The method according to claim 1 wherein said anodic oxidation is performed with an anode current of at least 1.5ma/cm$^2$.

13. The invention according to claim 1 wherein the anodic oxidation is performed in an electrolytic bath which is subjected to ultrasound.

14. The method according to claim 1, wherein the entire surface of the niobium part to be treated by dissolution is anodically oxidized prior to dissolution.

* * * * *